(12) United States Patent
Kilzer et al.

(10) Patent No.: US 9,377,507 B2
(45) Date of Patent: Jun. 28, 2016

(54) PROCESSOR DEVICE WITH INSTRUCTION TRACE CAPABILITIES

(71) Applicant: Microchip Technology Incorporated, Chandler, AZ (US)

(72) Inventors: Kevin Kilzer, Chandler, AZ (US); Justin Milks, Chandler, AZ (US); Sundar Balasubramanian, Chandler, AZ (US); Thomas Edward Perme, Chandler, AZ (US); Kushala Javagal, Phoenix, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 330 days.

(21) Appl. No.: 13/888,357

(22) Filed: May 6, 2013

(65) Prior Publication Data

US 2013/0318408 A1    Nov. 28, 2013

Related U.S. Application Data

(60) Provisional application No. 61/643,690, filed on May 7, 2012.

(51) Int. Cl.
*G06F 11/00* (2006.01)
*G01R 31/3177* (2006.01)
*G06F 11/36* (2006.01)

(52) U.S. Cl.
CPC ........ *G01R 31/3177* (2013.01); *G06F 11/3636* (2013.01); *G06F 11/3648* (2013.01)

(58) Field of Classification Search
CPC .............. G06F 11/25; G06F 11/362–11/366; G06F 11/3466–11/3495; G06F 11/323; G06F 11/3656; G06F 11/3664; G06F 15/7842; G06F 11/3636; G06F 11/0724; G06F 11/3648; G01R 31/3177

See application file for complete search history.

(56) References Cited

U.S. PATENT DOCUMENTS

| | | | |
|---|---|---|---|
| 5,978,902 A * | 11/1999 | Mann | 712/227 |
| 7,627,784 B1 * | 12/2009 | Allen | G06F 11/3636 714/30 |
| 2004/0103398 A1 | 5/2004 | Agarwala et al. | 717/128 |
| 2004/0133823 A1 | 7/2004 | Swoboda et al. | 714/39 |
| 2005/0060617 A1 * | 3/2005 | Huang | G06F 11/362 714/34 |
| 2005/0193254 A1 * | 9/2005 | Yee | G06F 11/267 714/30 |
| 2012/0095728 A1 * | 4/2012 | Ubukata | 702/186 |
| 2012/0144240 A1 * | 6/2012 | Rentschler et al. | 714/34 |

FOREIGN PATENT DOCUMENTS

WO    98/45782 A1    10/1998    ............ G06F 11/28

OTHER PUBLICATIONS

International Search Report and Written Opinion, Application No. PCT/US2013/039944, 11 pages, Jul. 12, 2013.

* cited by examiner

*Primary Examiner* — Jason Bryan
(74) *Attorney, Agent, or Firm* — Slayden Grubert Beard PLLC

(57) ABSTRACT

A processor device with debug capabilities has a central processing unit, debug circuitry including a trace module and an external interface, wherein the trace module generates a trace stream including information about executed instructions, wherein the trace stream is output through the external interface, and wherein the trace module is further operable to detect a trigger signal and upon detection to insert a trace packet into the generated trace stream.

25 Claims, 10 Drawing Sheets

PROCESSOR DEVICE WITH INSTRUCTION TRACE CAPABILITIES

CROSS-REFERENCE TO RELATED APPLICATIONS

This application claims the benefit of U.S. Provisional Application No. 61/643,690 filed on May 7, 2012, entitled "PROCESSOR DEVICE WITH INSTRUCTION TRACE CAPABILITIES", which is incorporated herein in its entirety

TECHNICAL FIELD

The present disclosure relates to processor devices, in particular microcontroller devices with integrated debug capabilities.

BACKGROUND

Modern microprocessors and microcontrollers include circuitry that efficiently allows an embedded developer to analyze a running program by means of a so-called in-circuit debugger or emulator device. To this end, a microcontroller or microprocessor provides for internal circuitry that supports debugging functions and a specific interface which can be for example activated by programming multiple function pins of the device to operate as the debug interface. Such an interface usually can be configured as a high speed serial interface to allow for fast communication between the actual device and the external debugger or emulator. The device itself can thus be operated in a normal operating mode which does not activate this interface and associated pins can be used for other purposes and a debug operating mode which uses this interface to exchange data with respective external devices, such as debuggers or emulators that can be operated from and by an external host computer. The debuggers or emulators can also be operated as programmers, wherein the program is transferred into the target device via the same debug interface. Together, a host computer with an external debugger or emulator form an inexpensive analysis and debugging system.

Modern processors and microcontrollers provide for an extended set of debug functions inside the respective device. For example, a number of breakpoints can be set within the device to allow the device to actually run in real time which would not be possible with an external debugger when using just a high speed serial interface and thus would require bond-out chips and expensive debug circuitry. However, the functionality of these internal debug circuitries is of course somewhat limited due to a limited amount of silicon real estate and other reasons.

For example, trace back functions are often not supported by external in circuit debuggers and even more complex in circuit emulators may not sufficiently support a trace function when in debug mode.

SUMMARY

Therefore a need exists, for an improved in circuit debug system, in particular a stand alone processor device with improved in circuit debugging capabilities. For example, a processor device according to various embodiments may allow an external trigger which is fed to the debug unit of the device, for example through an external pin, to produce a trace data packet, without otherwise halting device operation.

According to an embodiment, a processor device having debug capabilities, may comprise a central processing unit; debug circuitry including a trace module and an external interface; wherein the trace module generates a trace stream including information about executed instructions, wherein the trace stream is output through the external interface; and wherein the trace module is further operable to detect a trigger signal and upon detection to insert a trace packet into the generated trace stream.

According to a further embodiment, the trigger signal can be a trigger signal applied externally to the processor. According to a further embodiment, the trigger signal can be generated by an internal event. According to a further embodiment, the internal event may comprise at least one of: a breakpoint, a master clear, an interrupt, an exceptional execution condition, a debugger overflow condition. According to a further embodiment, the trace stream can be packet based. According to a further embodiment, the trace packet may include information about the trigger source. According to a further embodiment, the information can be provided conditionally, wherein the condition can be user defined. According to a further embodiment, the processor device may have multiple function pins and one pin can be assigned to operate as the trigger input for the external trigger signal. According to a further embodiment, the data packet can be inserted into the trace stream at a point in the trace stream that is time consistent with the execution of a reported instruction at the time of reception of the trigger signal. According to a further embodiment, the debug circuitry may further comprise an event combiner operable to combine a plurality of events, wherein an event can be created at least by one of: a breakpoint and the external trigger signal. According to a further embodiment, the trace data may identify the breakpoint or breakpoints that caused the event. According to a further embodiment, the trigger signal can be an asynchronous signal which is synchronized within the debug circuitry to a system clock. According to a further embodiment, the processor device may further comprise a noise reject filter coupled with an external pin receiving the external trigger signal. According to a further embodiment, the trace module can be programmable to detect a positive or negative edge of the external trigger signal.

According to another embodiment, a method for debugging executed code within a processor device may comprise: executing code by a central processing unit (CPU); generating a trace stream of instructions executed by the CPU; upon determining of a trigger signal, inserting a trace packet identifying the external trigger signal into the trace stream.

According to a further embodiment of the method, the trigger signal can be a trigger signal applied externally to the processor. According to a further embodiment of the method, the trigger signal can be generated by an internal event. According to a further embodiment of the method, the internal event may comprise at least one of: a breakpoint, a master clear, an interrupt, an exceptional execution condition, a debugger overflow condition. According to a further embodiment of the method, the method may further comprise outputting the trace stream through a debug interface upon request. According to a further embodiment of the method, the data packet can be inserted into the trace stream at a point in the trace stream that is time consistent with the execution of a reported instruction at the time of reception of the trigger signal. According to a further embodiment of the method, the trace stream can be packet based. According to a further embodiment of the method, the trace packet may include information about the trigger source. According to a further embodiment of the method, the information can be provided conditionally, wherein the condition can be user defined. According to a further embodiment of the method, the method may further comprise creating an event at least by one of: a breakpoint and the external trigger signal; combining a plurality of events to generate a debug function. According to a further embodiment of the method, the trace data may identify the breakpoint or breakpoints that caused the event. According to a further embodiment of the method, the debug function can be a trigger out signal or a halt. According to a further embodiment of the method, the trigger signal can be an asynchronous signal which is synchronized within the debug circuitry to a system clock. According to a further embodiment of the method, the method may further comprise filtering the external trigger signal by a noise reject filter coupled with an external pin. According to a further embodiment of the method, the method may further comprise programming the trace module to detect a positive or negative edge of the external trigger signal.

DETAILED DESCRIPTION

According to various embodiments, a debug unit within a target device may have a trigger input that allows internal events and/or external devices to optionally cause a breakpoint asynchronously, and the breakpoint entry is recorded in the trace data output. In some cases, the external trigger may not stop execution of the processor however, because stopping execution can produce undesirable or even dangerous operating conditions. According to some embodiments, the trigger input causes a specific trace record that allows the external event to be correlated to the running instructions (or vice versa).

When recording instruction data out of the trace, there is a disjoint between when a user pushed a button, and what the code was doing at the time. So essentially by creating a trace packet on a trigger-in pulse, it allows a user to align where the CPU was in the code execution stream with the time a trigger-in pulse was issued when analyzing the trace stream.

In combination with a peripheral tracing of the instruction data stream, according to various embodiments, a special packet indicating a trigger-in pulse occurred appears in the stream when a trigger-in pulse is detected.

Figure 1:
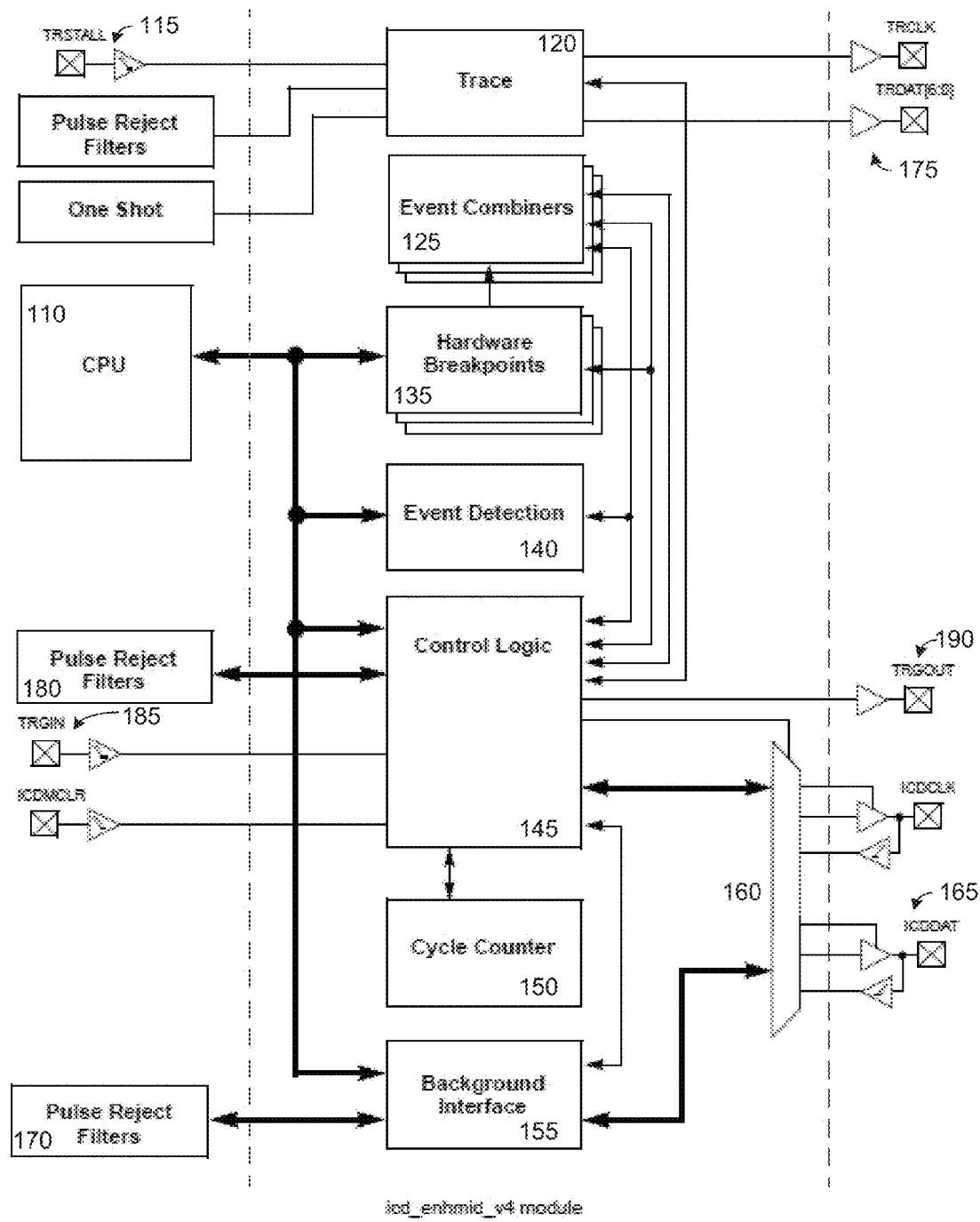
FIG. 1 shows a block diagram of an integrated debug module according to various embodiments.

FIG. 1 shows a block diagram of an in-circuit-debug module that can be integrated within a microcontroller according to an embodiment. However, the general concept as described above can be implemented in other types of on-chip debug circuitry. The block diagram shows a module that can be implemented for example in a microcontroller and may consists of five basic blocks:
Breakpoint Compare Logic 135
Stop-Watch Cycle counter Logic 150
Control and State Machine Logic 145
Trace Logic 120
Event Combiner logic 125
CPU 110 is coupled with hardware breakpoint unit 135, event detection unit 140, control logic unit 145 and background interface 155 through an internal bus. Multiplexer 160 is used to allow coupling of the debug unit with an external debugger through dedicated debug clock and data pins 165. The control logic 145 may be coupled with one or more external pins. FIG. 1 shows an exemplary TRGIN pin 185. Such a pin may be a dedicated pin with no other function. However, in particular in low-pin devices, such a pin may be a multi-function pin that allows to be assigned under program control to different peripheral devices and therefore can perform different functions according to its programmed assignment. For example, such a pin may be programmed by means of a configuration register to be in addition to the trace trigger in function to act as a serial interface clock pin, a digital I/O pin, an analog input pin, etc. As shown in FIG. 1 the control logic also provides for a trigger out pin 190 that can be similar to pin 185 a multi-function pin. The trace module 120 is coupled with a trace stall input pin 115, and trace clock and data output pins 175. FIG. 1 also shows pulse reject filters 170 and 180 that may be configurable through control logic 145. Signal routing through such filters is not shown in FIG. 1. According to some embodiments, breakpoint debugging is implemented such that execution is halted before the instruction is executed, so-called "zero skid" operation. According to other debugger embodiments this is not true and may cause problems with where code stops or "skids", allowing an instruction to execute before the processor is halted. External events are (by definition) asynchronous to the instruction execution stream. As such, their operation cannot be compared to zero skid concepts.

When an internal signal debug_en=1, the module is enabled and monitors all the "HALT" events, generates events, performs data capture, etc. If the internal signal debug_en=0, all debug logic is disabled and the module is configured to consume minimum power mode.

To make debugging less invasive, it may be useful to have a means of streaming data off the device in real-time. The trace module 120 supports a method taking data being read or written to a specific address and transmitting it out the Trace port. This can be described as a Real-time watchpoint. Normal operation of the device is not interrupted when using a watchpoint. Data capture may be performed using the same hardware as is used for generating a hardware breakpoint. Using a breakpoint for data capture at the same time as generating a halt will allow both operations to occur. However, enabling data capture and data matching at the same time may generate unexpected results, especially for breakpoint counts greater than one. As the data capture and data compare use the same physical register, the compare value will be updated on every capture. To this end, either internal or external events can generate a trigger that causes the debugging circuitry in the processor to insert a respective data packet into the trace data stream. The external event can be an external signal applied to the trigger in input TRGIN 185. The internal event can be any event such as a breakpoint/watchpoint, a master clear, an interrupt, an exceptional execution condition, a debugger overflow condition. The exceptional conditions may include interrupts, sleep mode entering or exiting, stack overflow/underflow, fetching of instructions from illegal addresses. Tables 1 and 2 shows a list of possible events. These tables are not inclusive or exclusive and should be considered as examples for trigger events. Other internal events or combinations of events may be used to generate a trigger signal for inserting a specific data packet into the trace stream.

TABLE 1

| Value | Interrupt Source |
| --- | --- |
| 7'b00 | System interrupt to 0004 |
| 7'b01 ... 7'b39 | Unused/reserved |
| 7'b3A | ICD_IRQ 0 (software breakpoint) to 8005 |
| 7'b3B | ICD_IRQ 1 (software breakpoint) to 800D |
| 7'b3C | Halt entry to 8004 |
| 7'b3D | Breakpoint entry to 8004 |
| 7'b3E | Event combiner entry to 8004 |
| 7'b3F | Other debug entry to 8004 |

TABLE 2

| Value | Reset Cause |
| --- | --- |
| 4'h0 | Reserved for internal test |
| 4'h1 | Brown-out |
| 4'h2 | RESET instruction |
| 4'h3 | MCLR input asserted (during operation) |
| 4'h4 | Watchdog Timer timeout |
| 4'h5 | Instruction ECC data error |
| 4'h6 | Stack underflow |
| 4'h7 | Stack overflow |
| 4'b1xxx | Reserved for future expansion |

Figure 2:
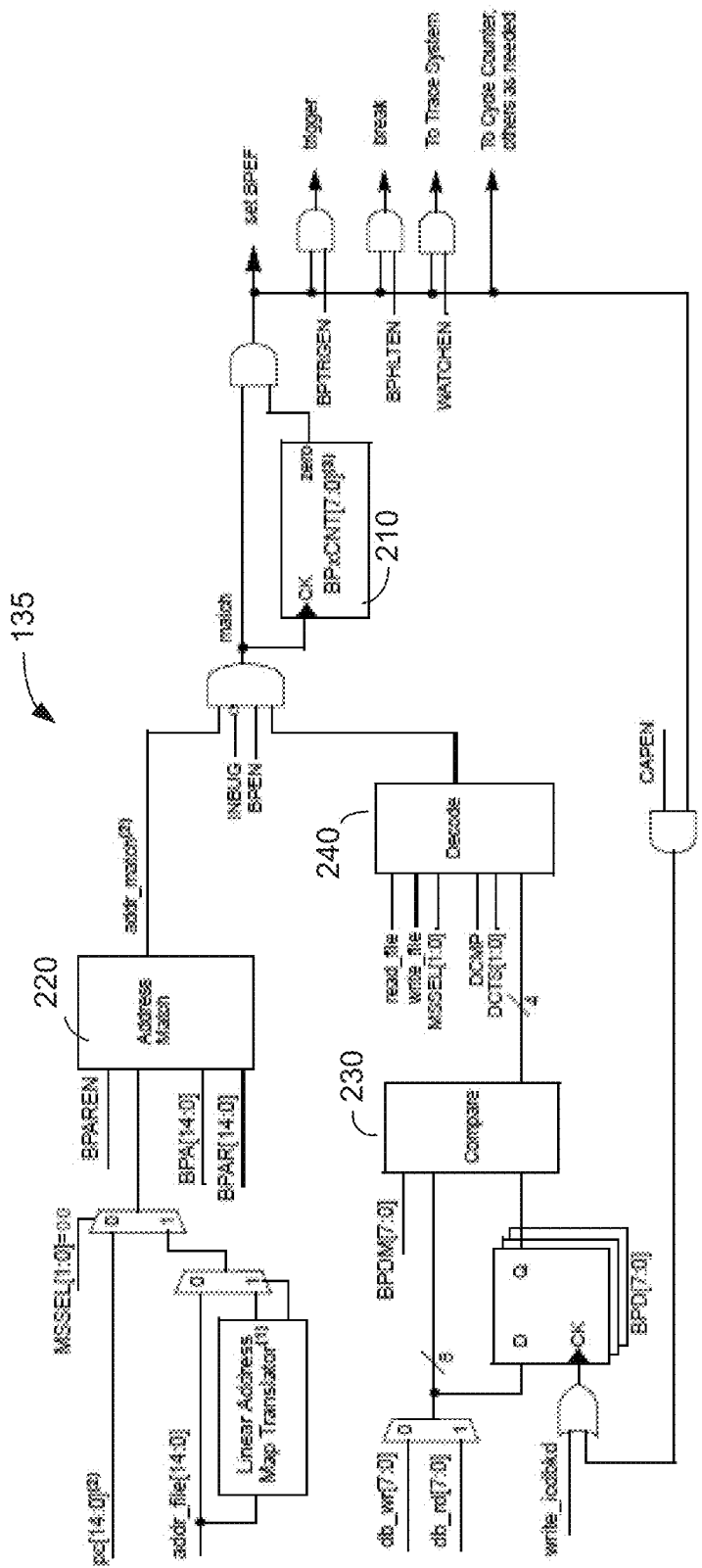
FIG. 2 shows a hardware breakpoint block diagram of FIG. 1 in more detail.

FIG. 2 shows the hardware breakpoint unit 135 in more detail. Hardware breakpoints can be configured to break on matching addresses in either program or data memory. To this end, respective comparators 220 and 230 and decoding units 240 are provided as shown in FIG. 2. When the breakpoint is selected to operate on data memory, the breakpoint can additionally be qualified with data value and a mask, allowing only certain values to generate a breakpoint event. Data breakpoints can also optionally be set to only break on read or write cycles. In all cases, the breakpoints have a counter 210 so that the specific event must occur N times before the breakpoint event is generated. This can be set, for example, for any value from 1 to 256 times according to some embodiments.

The block diagram of FIG. 2 is shown for a single breakpoint. The number of breakpoints implemented is however variable according to various embodiments, many breakpoints may exist. FIG. 2 shows an exemplary embodiment that allows various parameters to be programmed to define the trigger requirements for a breakpoint. According to other embodiments, less or more of such parameters may be used. For example, the number of breakpoint occurrences necessary to generate a breakpoint can be set by the BPxCNT parameter in counter 210. Each breakpoint module may have identical registers.

Breakpoints are listed among the event channel definitions and can be used to start or stop the cycle counter 150, set or reset an event combiner stage 125, start or stop trace unit 120, or take a stack snapshot.

According to one embodiment, for the breakpoint to be enabled, the bit BPEN of a control register ICDBPxCON must be set. If this bit is cleared, all circuitry for this specific breakpoint is disabled and no breakpoint events will be generated. The breakpoint can be configured to only trigger an action on every N-th occurrence of the qualifying conditions. For example, to set a breakpoint to trigger on every third occurrence, the counter 210 is set to BPxCNT=2. Respective control registers may be used in combination with counter 210 to reload its value and/or monitor the current state.

Breakpoints may also be qualified based on execution context (main line code, interrupt handler, or either), by setting respective bits, for example in an associated configuration register. A breakpoint may then only occur when the program is executing from a selected context.

Yet another breakpoint parameter may be used, by setting respective bits in a configuration register, which allow to monitor the program counter (PC execution address). Program Memory breaks are zero skid, and occur before the operation is executed. The PC will indicate the address of the trigger instruction.

When a respective control bit is cleared, e.g. BPAREN='0', a break is triggered when the PC equals a predefined address. When BPAREN=;1', a break is trigged when the PC falls within the predefined inclusive range of addresses.

According to some embodiments, only executed instructions can generate a breakpoint. If the PC is at an address that is not executed, the breakpoint does not trigger. This includes:
 flow changing instructions (CALL, RETURN, etc.),
 skipped instructions (per BTFSS, BTFSC), or
 the next fetch after a PCL, FSR, or other two cycle instructions.

When another control bit field is set to 01, 10, or 11 in a control register, the breakpoint monitors data accesses, both address and value. The three states of the associated bits select whether read or write cycles are used to determine the breakpoint.

Data breakpoints, by necessity, cause a break at the end of instruction execution, after data is read or written (as applicable). In all cases, the instruction runs to completion. Accordingly, the "break" actually occurs on the next instruction execution, and the PC will indicate the instruction following the trigger instruction. A break may also be triggered when both the memory address and data value qualifiers have been met.

The cycle counter 150 is a counter used to provide a stopwatch function so that user code can be profiled. The cycle counter is controlled by respective control registers. The counter 150 may consist of four 8-bit counter/registers. The counter 150 may be incremented at the end of every Q-cycle of the CPU; multi-cycle instructions (e.g., GOTO) count multiple times.

In order to allow multiple functions to be controlled by specific events, all of the possible sources in the may be combined into one event bus. This allows the Cycle Counter 150, Trace unit 120, and Event combiners unit 125 to use the same settings to select their actions.

Figure 3:
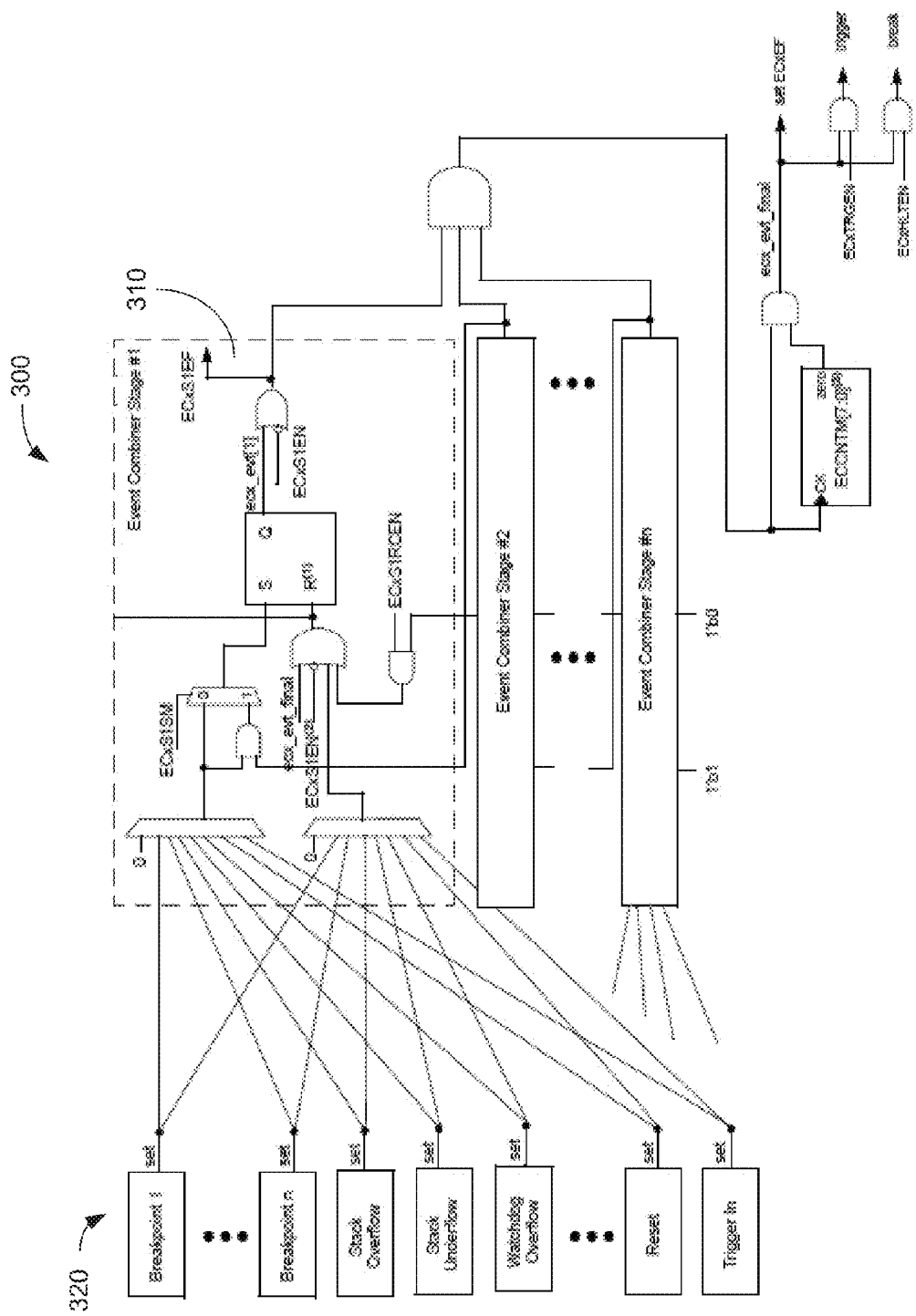
FIG. 3 shows an event combiner block diagram of FIG. 1 in more detail.

An event combiner 300 as shown in FIG. 3 monitors multiple event inputs 320 and can generate a halt or a trigger out 190 based on combinations and sequences of those inputs. An event combiner 300 is enabled when a respective control bit is set. Disabled combiners 300 do not produce output events. Event combiners 300 are listed among the event channel definitions and can be used to start or stop the cycle counter 150, set or reset an event combiner stage 310, start or stop trace unit 120, or take a stack snapshot. Event combiner stages 310 are independently enabled when respective control bits for that stage are set in associated control registers. A stage's current output will be reflected in an associated status bit. Stages 310 have an implied order as shown in FIG. 3, and can be combined in a number of ways:
- a stage can be activated individually by an event,
- a stage can be activated by an event while the next lower stage is active,
- a stage can be deactivated individually by an event,
- a stage can be deactivated by an event or when the next lower stage is deactivated By setting a respective control bit, only the (N+1)-th occurrence of the combined event(s) will signal an output event. N can be set from 0 to 255. If the combined trigger conditions are met, then the register is decremented by 1. If the combined trigger conditions are met, an event combiner event is generated and the counter is reloaded with the preset value. Also, any time a new count value is written into the respective control register, the value in the counter is reloaded. For example, to set a breakpoint to trigger on the third occurrence, the respective counter value should be set to 2.

In addition according to some embodiments, an external signal fed to pin TRGIN 185 allows a user input to generate trace packets to be inserted into a trace stream, generate halts and optionally also trigger TRGOUT signals. When "Polarity"=0 (FIG. 6) the trigger input is active high and rising edges cause events. When "Polarity"=1, the trigger input is active low and falling edges cause events. Another control bit may be used to control the filter, for example, to define that the input must be in the active state for a minimum time in order to be recognized. Shorter pulses are then ignored.

The TRGIN event can be listed among the event channel definitions and can be used to start or stop the cycle counter 150, set or reset an event combiner stage 310, start or stop trace unit 120, or take a stack snapshot. Changes in the trigger input will generate a Trace packet if Trace is enabled.

When an event, such as a breakpoint, occurs with an enabled trigger, a pulse on the TRGOUT pin 195 is generated. The basic trigger output signal operation is configured by setting respective control bits. These control bits may for example control that the Trigger Output is asserted for approximately the duration of the trigger event. Adjacent or overlapping events may hold the signal in the asserted state. The control bits may also control whether the output is stretched to a minimum time period. Once the TRGOUT one-shot is triggered, more events occurring within the timing period will be ignored. After the one-shot times out and TRGOUT returns to zero, it may again be triggered by another event. The one-shot is edge triggered, and will clear after a predefined time period even if the event signal persists.

Software may cause a Trigger Out by setting a respective control bit. If the device is awake, the bit is cleared by hardware after 1 cycle. TRGOUT may also be cleared by writing a respective control bit, or will be cleared automatically when the device wakes up.

Figure 4:
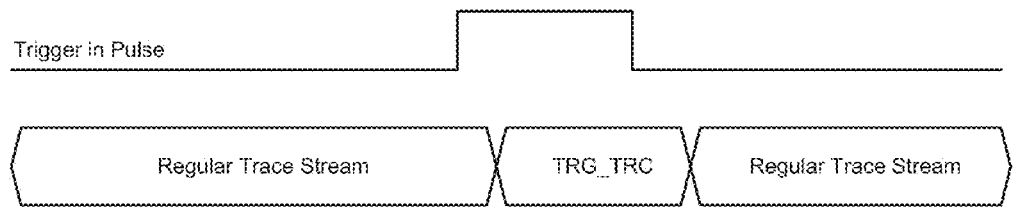
FIG. 4 represents how a trigger-in pulse causes a trigger packet to be transmitted in the trace data.

FIG. 4 shows a regular trace stream along with an externally asserted "trigger in" signal. When the "trigger in" pulse occurs in the middle of a trace instruction stream, a "TRG TRC" packet is inserted into the regular trace stream to signify that at that time in the stream the trigger occurred. Changes in the trigger input will generate a Trace packet if a respective control bit is set. If the polarity bit=0, the event will trigger on the rising edge. If the polarity bit=1, the event will trigger on the falling edge. As shown in FIG. 4, the externally applied signal that causes the insertion of the trigger trace packet is asynchronous to the execution of instructions. Trigger trace packets generated by internal events are mostly synchronous. However, the same principle applies with respect to the insertion into the trace data stream.

Figure 5:
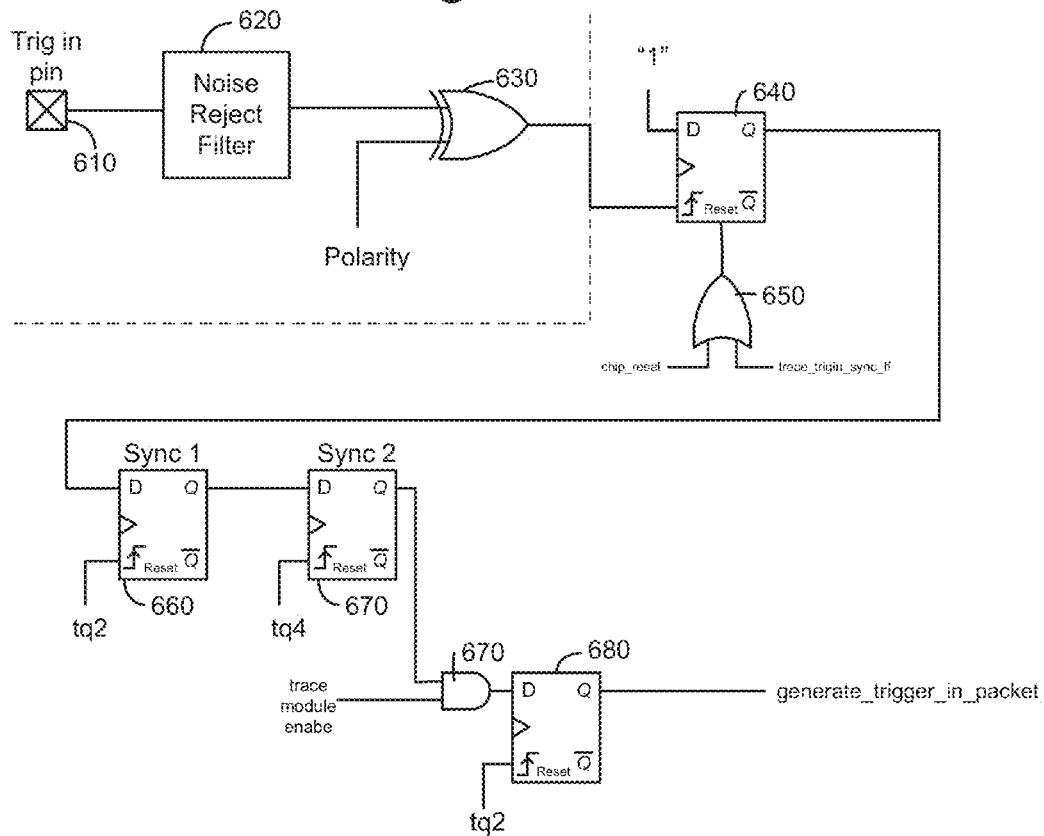
FIG. 5 shows possible implementation details of a debug unit within a processor device with trace functionality.

FIG. 5 is a simplified diagram of the concept's implementation from trigger pin to trace packet write clock and data. Certain signals according to various embodiments are shown, but the parts of the trace module which transmits the packet and some of the trace functionality can be realized in may different ways and is therefore not shown.

According to the embodiment shown in FIG. 5, the trigger signal is coming in asynchronously through an external pin 610 and may be subject to some filtering by means of, for example, a noise reject filter 620. However, such a filter could also be omitted or if implemented could be implemented as an analog or digital filter or a combination of both. Furthermore, a polarity selection unit 630 could be implemented according to some embodiments. To this end, a simple XOR gate 630 receiving the output of noise reject filter 620 or the trigger signal directly can be provided. The second input of XOR gate 630 receives a polarity control signal. Thus, the incoming trigger signal is either inverted or not. Hence, a user can control the device to always generate a positive pulse internally no matter what the polarity of the trigger pulse is. However, other processing of an external signal may apply and therefore the "trigger in" functionality is per se not critical. The dashed line separates the "trigger in" section from the trace use of the "trigger in" signal.

Figure 10:
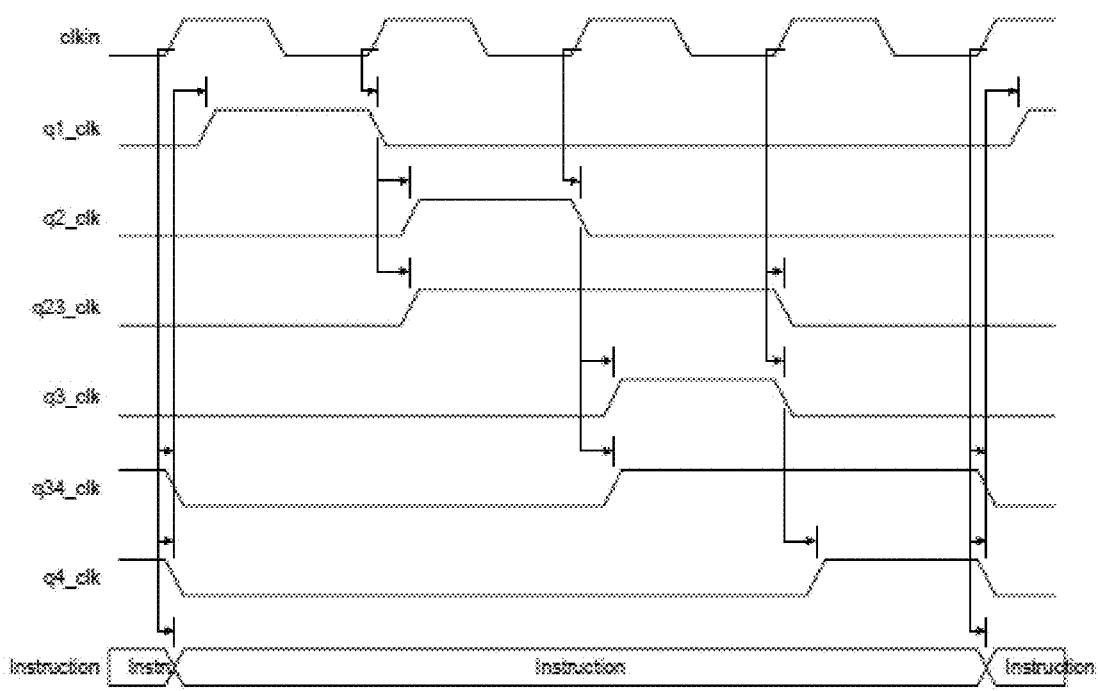
FIG. 10 shows a timing diagram of a microcontroller internal clocking signals.

The positive trigger in pulse is asynchronous within the device. It goes to a first flip flop 640 for the trace module which detects the event, and registers it. That first flip flop 640 is asynchronous also because of the connection of the trigger in pulse as a clock signal. The registered asynchronous signal flip flop output Q is then synchronized over 2 subsequent internal clocks, a trace clock tq2 and tq4, respectively. According to some embodiments, these internal clocks are synchronized to the instruction clock but may not correspond to the actual instruction clock of an internal system clock because in some embodiments, the system clock may actually use a quadrature clock, for example 4 q-clocks, to execute one instruction cycle. FIG. 10 shows an exemplary timing diagram of a system clock clkin and related quadrature signals with respect to the execution of an instruction. In this embodiment, four clocks q1, q2, q3, q4 derived from clkin are used to execute one instruction. Trace clocks may be derived from internal clocks q1, q2, q3, q4 or may be identical these clocks.

Two flip-flops 660 and 670 are coupled in series and clocked by the tq2 and tq4 internal clock signal as shown in FIG. 5. The output Q of flip-flop 670 provides then for a synchronized trigger signal. Output Q of flip-flop 670 can be coupled with an AND gate 670 which is implemented to provide for a trace module enable function.

This synchronized signal may now be safely used, for example, through the AND gate 670 inside the trace module of the debug unit. The synchronized signal goes to an "outband" write flip flop 680, wherein "outband" does not mean an instruction, and that effectively will create a write clock. The data to be written may be implemented as follows:

```
begin
    if(.....)
    else if (....)
    else if (generate_trigger_in_packet)
        data = TRIGIN PACKET
    else
end;
```

Thus, flip-flop 680 generates a synchronized write clock signal and the debug unit generates an actual data packet with data to be inserted into the regular trace stream. The data to be inserted can be predetermined or may have a predetermined and a dynamic portion including event dependent data.

As shown above, the mechanism to generate this packet can be for example a big if-elseif-else statement where the priority of what to send is given. The generation of the packet data may be prioritized as shown above wherein the various "if-elseif" steps allow for the generation of other output signals and therefore create a predefined order or priority. According to some embodiments, the trigger-in trace packet may have a relatively low priority over other things such as overflow errors and other similar events as shown in the above example.

According to some embodiments the actual trace trigger data may be generated while the actual "trigger in" write signal is synchronized. Thus, one concept can be seen in that this data develops the packet here, and when the write clock comes it will write the trigger data into a packet that can be inserted into the trace stream. It interacts with the other natural trace packets, and hence the need for priorities and such.

Figure 6:
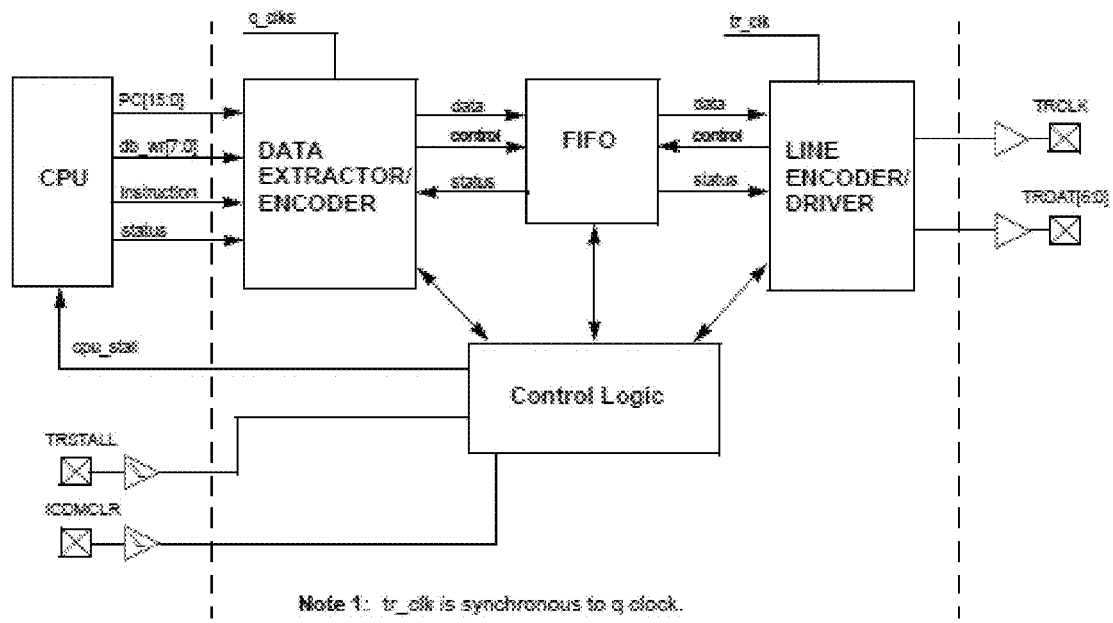
FIG. 6 shows a simplified block diagram of the trace block 120 illustrated in FIG. 1.

The following section details the trace data interface between the device and an external debug tool according to a specific embodiment. Other embodiments may use different implementations. The Trace subsystem as for example shown in FIG. 6 provides a real-time record of the instruction execution stream that can be captured and analyzed by a debug tool. Trace operation assumes that the debug tool has access to the source code and program memory content, and can infer some aspects of CPU operation.

Figure 7:
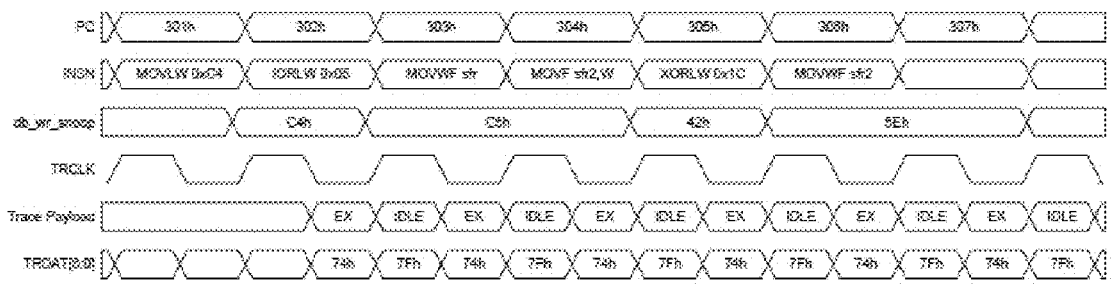
FIG. 7 shows a timing diagram of processor execution and trace data read-out.
Figure 11:
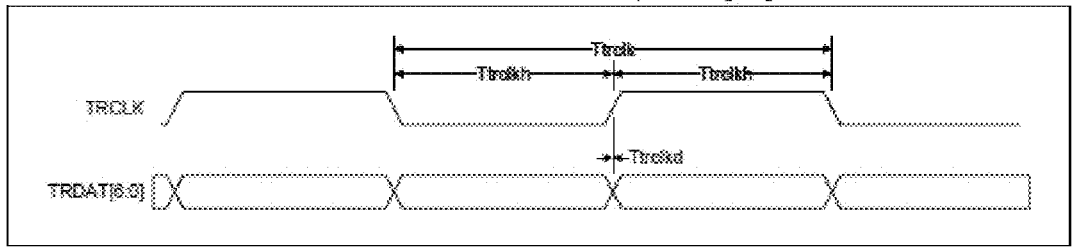
FIG. 11 shows the relationship of trace clock and data.
Figure 11:
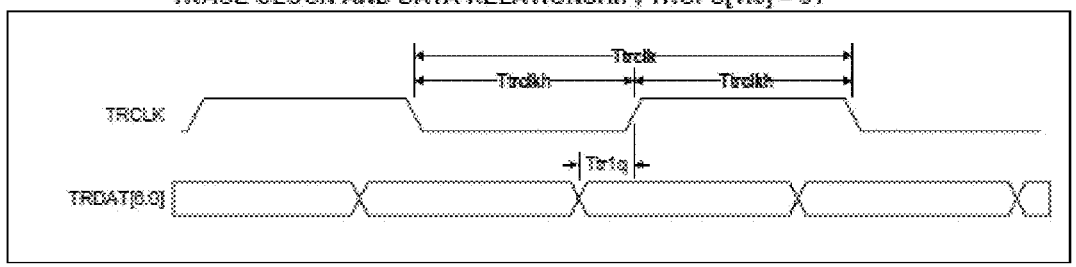
Figure 11:
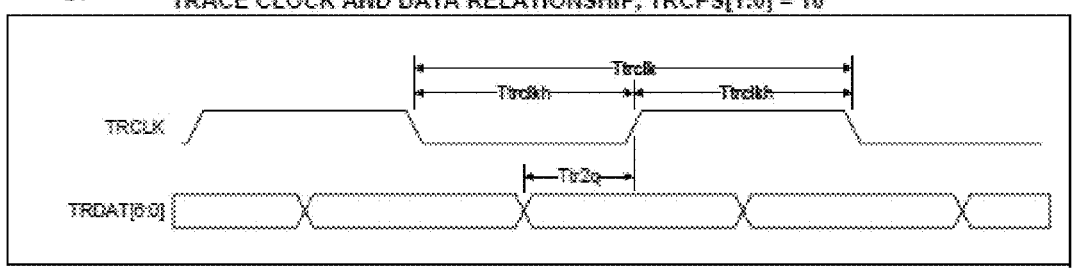
Figure 11:
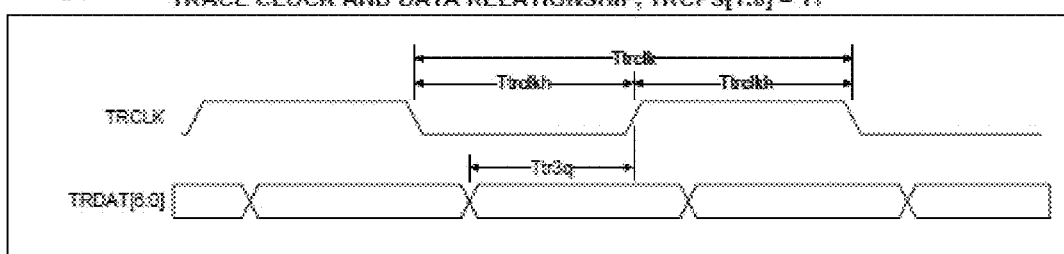

When an instruction writes to PCL (either directly or through INDx), the new PC may be anywhere in program memory. In this case, the instruction packet is replaced by so called full program counter (FPC) packet. A FIFO as shown in FIG. 6 can be used to match the core data rate with the debug tool data rate (governed by TRSTALL). The FIFO is filled from the CPU encoder, and is emptied by the data encoder, as illustrated in FIG. 6. The FIFO holds up to 4096 instruction packets, but the effective operating size may be selected by respective control bits. WATCH event packets are also placed into the FIFO, so the actual number of instruction packets in-flight will usually be less. FIG. 11 shows the relationship between the trace clock and data according to different configuration settings A, B, C, and D. The TRCLK output, when toggling, outputs one data word with each clock edge. The output clock rate is always linked to the CPU instruction rate, and will change if software changes SYSCLK, or if a reset changes SYSCLK. According to respective configuration, the output rate can always be two trace words per instruction period. The rate can be reduced to 1-per and ½-per instruction, although this will likely lead to FIFO overflow. The TRCLK output can be selected to either be in phase with the data changes or out of phase, depending on the setting of the TRCPS control bits. The in-FIFO encoding may be different than the line encoding, so each FIFO location may represent as many as 3 data words in the TRDAT interface. According to some embodiments, an overflow of the FIFO within the trace subsystem may also be used as an event to generate an trace trigger signal for inserting a trigger trace packet A trace stall function can be implemented wherein a configuration bit may determine whether the TRSTALL input has effect or not. For example, when control bit TRXSE=1 and signal TRSTALL=1, the trace FIFO will stop emptying on a payload boundary and stop the clock. When TRSTALL (tr_stall_pin) returns to '0', clocking will resume and the FIFO will begin emptying data again. When trace is enabled and the FIFO is empty, IDLE or SLEEP packets are sent according to the sleep state of the device. The FIFO can also be forced empty and trace can be deactivated according to some embodiments. If the FIFO becomes full, the system response may depends on a respective control setting. In any case, the overflow state (stalled or not posting data) will persist until the FIFO is either 25% or 75% full, as selected by a respective control register. Other functions regarding a trace implementation may be added and some functions as described may not be implemented according to some embodiments. A typical trace signal timing diagram is shown in FIG. 7. Trace payload packets encode the instructions that the CPU core executes and selected data events, and also provide trace stream synchronization. According to an embodiment, most packets may consist of 1 or 2 seven (7)-bit words, or 3 words for a so called full program counter (FPC) packet. Generally speaking, the packets consist of a "word 1" and an optional "word 2". However, other formats may be used according to different embodiments. According to a specific embodiment, the value of "word 1" identifies the packet, and implies whether or not "word 2" exists. Packets that are synchronous to instruction execution (like EX, EXD, and RESET) and asynchronous "Event" packets include WATCH, RESET, and TRIGGER as described below in more detail.

Synchronous packets are emitted in the order of execution. Event packets appear in the stream near the time of the event, but if a number of events happen simultaneously, some reports will be delayed. In some cases, FPC is a synchronous report, but at other times it is an event. Transport layer (TR) packets RESYNC, IDLE and END are inserted as required to manage and identify the various states of the interface data stream. TR packets RESYNC and IDLE may be discarded when analyzing the instruction trace.

RESYNC packets are inserted periodically as specified by respective control bits, so that the receiver may verify that it is correctly synchronized. At times roughly corresponding to a predefined time interval, and only if no other FPC has been sent within the interval, an FPC will be added to the stream. This provides a check that the receiver is correctly tracking the instruction stream. Inserted FPCs always indicate the address of the instruction that follows. The number of words in a packet is determined by the value of packet word 1. If RESYNC is received as a word 1 with an incorrect value for "word 2", then the stream is out of sync and an error should be flagged.

Table 3 illustrates a worst-case situation involving a 2-word packet where the 2nd word is 0x7D, followed by a RESYNC. If the receiver is properly synchronized, received word #3 will be a word 1, and word #4 will be a word 2, forming a complete RESYNC pair that is shown as packet #2. Packet #3 begins with word #5, and will be correctly interpreted.

TABLE 3

| Received word | | Packet | |
| --- | --- | --- | --- |
| # | Value | Type/data | # |
| 1 | 0x71 | EXD 0xFD | 1 |
| 2 | 0x7D | | |
| 3 | 0x7D | RESYNC | 2 |
| 4 | 0x7D | | |
| 5 | 0x74 | EX | 3 |

Table 42 shows the same data with a clock-bounce duplicating the first word and throwing the receiver out of sync.

Words #1 and #2 are received as an EXD packet with data=0x71 (but this is an incorrect interpretation), and words #3 and #4 appear to be a RESYNC pair. Word #5 is taken as word 1 of a new RESYNC packet, but word #6 is not 0x7D, revealing the out-of-sync state. Word #6 begins a new packet.

TABLE 4

| Received word | | Packet | |
|---|---|---|---|
| # | Value | Type/data | # |
| 1 | 0x71 | EXD 0xF1 | 1 |
| 2 | 0x71[1] | | |
| 3 | 0x7D | RESYNC | 2 |
| 4 | 0x7D | | |
| 5 | 0x7D | Error | Note 2 |
| 6 | 0x74 | | 3 |

Note

[1]Receiving a duplicate word is typical of an impedance mismatch in the clock cable.

2: It is sufficient to say that the first non-0x7D that follows any 0x7D packet (word 1 = 0x7D) is always a word 1 (or FPC word #3). The receiver must immediately re-interpret word #6 as the first word in a new packet.

The first packet sent when tracing begins, or when tracing resumes after being suspended for the debug executive, will always be an FPC. The Full Program Counter (FPC) packet reports the absolute address of the next instruction that appears in the stream. The FPC report in these situations: start of trace, resumption after overflow, and resumption after debug, which simply indicates the address of the next instruction.

All other uses of FPC indicate that an instruction has executed, and in some cases replaces the packet that would have been reported for that instruction. When the FPC represents execution of a branch or program counter altering instructions, the value reported is the branch target address. The instruction packet following the FPC represents the execution of the instruction to which the FPC points.

The GOTO and CALL instructions assume that the least significant bits of the program counter PC[10:0] are known to the debug environment (in the assembly code), and only the upper 4 bits of the new PC are reported in an upper partial program counter (UPC) packet. However, other embodiments may report more or less information. The reported value can be 0x0F & (PCLATH >>3), wherein PCLATH represents an implementation specific register that latches the upper bits of the program counter. Since the destination of relative branches (BRA) is known to the source code, the instruction is reported simply as EX. A wide variety of trace payloads may be implemented. Table 5 shows an example of different payload signals.

TABLE 5

| Mnemonic | Description | Group | Trace Encoding Word 1 (Word 3) | Word 2 | Number of 7 bit words Sent | Sent when TRIEN = 0 |
|---|---|---|---|---|---|---|
| WATCH | Data trace watch point | Trace data | o ccccc d | ddd dddd | 2 | Yes |
| FPC | Full new PC, P = PC[14:0] Implies execution of the current instruction The 2 packets are sent contiguously. | | 100 pppp (PC[14:11]) 101 pppp (PC[3:0]) | ppp pppp (PC[10:4]) | 3 | 1 FPC within RESYNC interval |
| UPC | Upper Partial PC, P = PC[14:11] Implies execution of the current instruction | | 110 pppp (PC[14:11]) | | 1 | No |
| EXD | Execute instruction, D = data stored | | 111 000d | ddd dddd | 2 | No |
| EX | Execute instruction | | 111 0100 | | 1 | No |
| STALL | No instruction is executed (forced to NOP) PC is unchanged (Section 3.19.3.5) | | 111 0101 | | 1 | No |
| SKIP | No instruction is executed (forced to NOP) PC is incremented | | 111 0110 | | 1 | No |
| OVERFLOW | FIFO has overflowed, data was lost | | 111 0111 | 111 0111 | 2[3] | Yes |
| INT | Interrupt Vector Vectoring to interrupt vector N | | 111 1000 | nnn nnnn Table 3-8 | 2 | No |
| RESET | CPU is being reset PC is now equal to RSTVEC | | 111 1010 | v00 nnnn FIG. 3-4 | 2 | Yes |
| ERROR | An internal error is noted; refer to hardware documentation for details. | | 111 1010 | xlx eeee FIG. 3-4 | 2 | Yes |
| TRIGGER | TRGTR = 1 and Trigger input change | | 111 1011 | | 1 | Yes |
| SLEEP | TREN = 2'b1X, FIFO is empty, Sleeping | Transport | 111 1100 | | 1 | Yes |
| RESYNC | Periodic resync. FPC will be sent with the same interval. | | 111 1101 | 111 1101 | 2[3] | Yes |
| IDLE | TREN = 2'b1X, FIFO is empty (not Sleeping, not TRSTALL) | | 111 1110 | | 1 | Yes |
| END | TREN = 2'b00 | | 111 1111 | 111 1111 | 2 or 3[2,3] | Yes |
| Reserved | | | 111 001x 111 1001 | | 1 | |

Note

[1]All fields are sent MSB first

[2]The END packet will be sent at least twice, and possibly a third time so that TRCLK stops in the low state.

[3]The receiver should handle OVERFLOW, RESYNC and END as 1-word packets; see the discussion in Appendix A.2.3.

Legend:

c = Channel for watchpoint d = Write Data p = Program counter

Table 6 shows an actual trace example:

TABLE 6

| Cycle | PC(0x) | Instruction Opcode | Packet Type/data |
|---|---|---|---|
| 1 | 123 | MOVLW HIGH(2300) | EX |
| 2 | 124 | MOVWF PCLATH | EXD 8'h23 |
| 3 | 125 | MOVLW #3 | EX |
| 4 | 125 | CALL 200 | |
| 5 | | | UPC-4[1] |
| 6 | 2200 | BTFSS W,7 | EX |
| 7 | 2201 | BRA $ + 4 | |
| 8 | | | FPC |
| 9 | 2205 | NOP(Note 2) | EX |
| 10 | 2206 | BRW | |
| 11 | | | FPC 220A[2] |
| 11 | 220A | RETLW #77 | |
| 12 | | | FPC |
| 13 | 126 | NOP | EX |
| 14 | 127 | CALLW | |
| 15 | | | FPC 2377[1] |
| 16 | 2377 | NOP | EX |
| 17 | 2378 | GOTO 500 | |
| 18 | | | UPC-4[1] |
| 19 | 2500 | NOP | EX |
| 20 | 2501 | RETURN | |
| 21 | | | FPC |
| 22 | 128 | NOP | EX |

Note
[1]If TRFPCB = 1, this instruction reports FPC.
[2]The PC value for cycle 8 is not 15'h2205 because PCLATH = 8'h23 (from cycle 2); the UI should flag this error.

Figure 8:
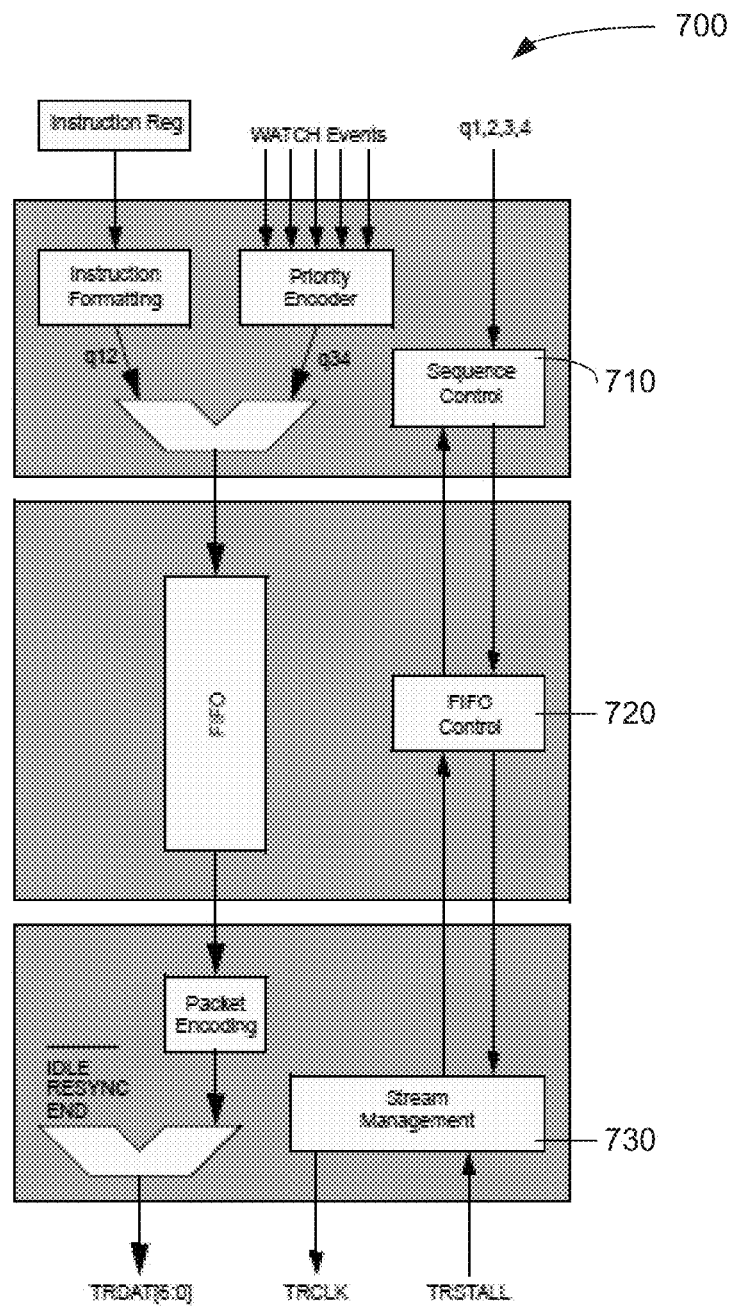
FIG. 8 shows an embodiment of the trace sub system illustrated in FIG. 6.

FIG. 8 shows a simplified block diagram of the trace sub system 700. The subsystem 700 receives instruction codes from the core and WATCH event signals, and formats this data for delivery on the TRDAT signals. The sequence controller 710 is responsible for loading instruction and WATCH data into the FIFO. Each data packet is encoded as a single 16-bit word. During q34, the WATCH signals are sampled, and the signal of highest priority is encoded, loaded, and reset. If more than one signal is asserted, only the highest priority signal is loaded and the others must wait for subsequent q34 opportunities. Since report priority is based on breakpoint number, events may be reported out of order. During q12, data from the previous instruction is encoded and loaded (the opcode is encoded in q3, and bus data is stable q3-q3, and all is valid at rising q1). Generally speaking, this occurs every instruction period. For branch and call instructions, as well as interrupt cycles, nothing is loaded during the first cycle, and the packet is encoded during the 2nd cycle (the so-called "forced NOP"), allowing UPC and FPC to be emitted with the correct PC value. Consequently, two WATCH packets may be loaded during a branch. SKIP and STALL are encoded based on the current core operation.

The sequence controller 710 can load twice per instruction cycle, and the stream manager 730 can unload twice per instruction cycle, requiring up to four (4) memory cycles per instruction cycle. The FIFO controller 720 manages the data provided by the sequence controller 710. Data is delivered in the same order, when requested by the stream manager 730. The stream manager 730 reformats the 16-bit FIFO words into the data words transmitted on the TRDAT signals. Some packets (e.g., EX) produce a single TRDAT word for each FIFO word, while others (e.g., FPC) produce more. As required, the transport management packets RESYNC, IDLE and END are inserted into the stream, and the read-out operation is paused according to the TRSTALL input. There are two (2) TRDAT words transmitted during each instruction cycle period. The TRCLK signal will pause (stretch part of a cycle) during a system reset (data will not be lost).

Figure 9:
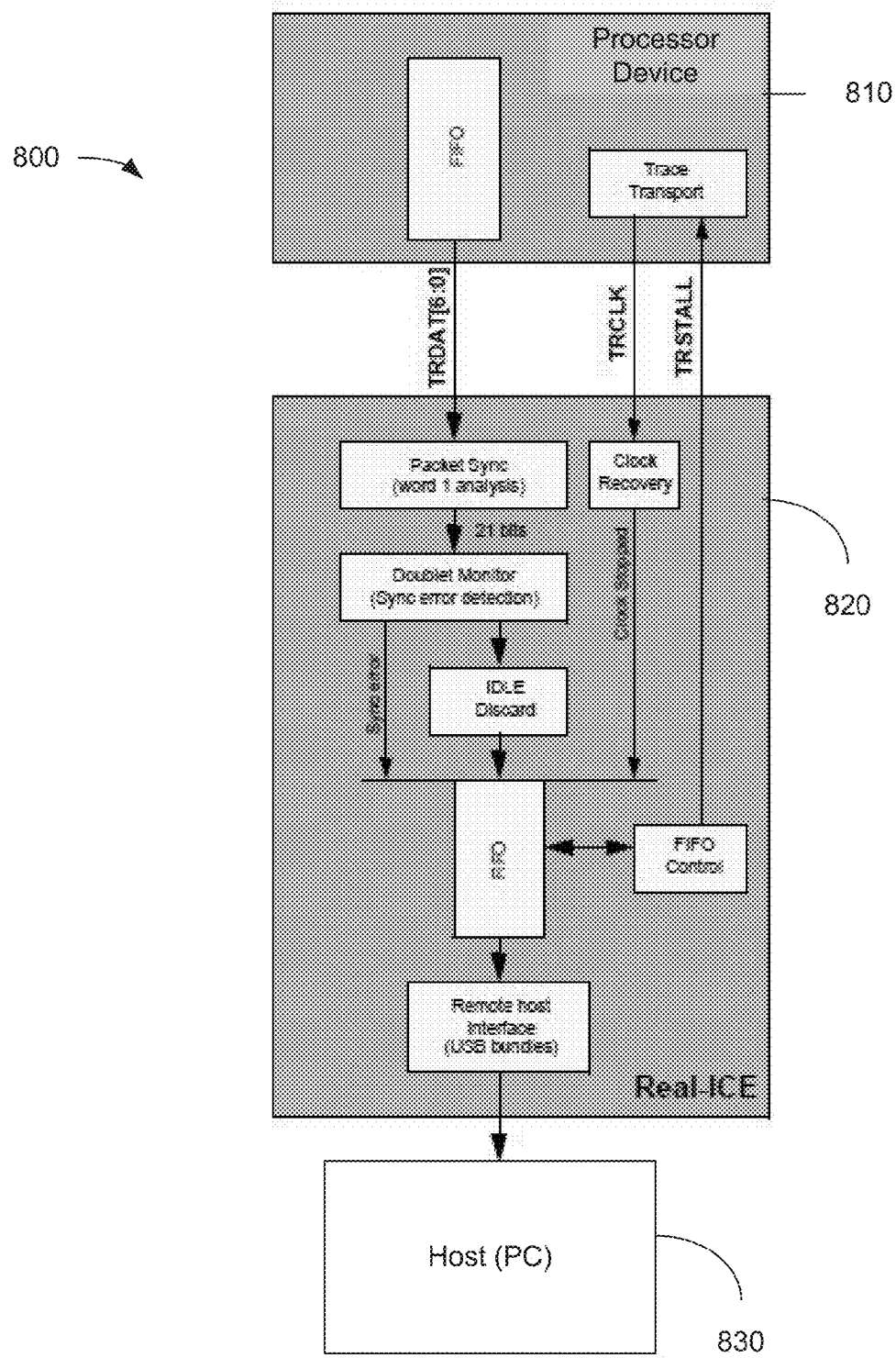
FIG. 9 shows a block diagram of the suggested trace recovery hardware, showing the interface to a microprocessor.

FIG. 9 shows a system 800 with a microcontroller 810 according to various embodiments coupled with a debug tool 820 operating as a trace receiver. The debug tool can be, for example, a Real-ICE in circuit emulator manufactured by Applicant. The receiver 820 performs trace synchronization, discards all IDLE and Transport packets, and transmits bundles of the remaining packets to a remote host 830, for example a personal computer or work station where packet stream interpretation is performed.

Word 1 analysis—convert packets to a 3-wordwide data bus.
Examine doublets (RESYNC, OVERFLOW, etc.), and flag sync errors when (a) doublets are not in consecutive words, or (b) an unimplemented word 1 code value is seen.
Discard IDLE and other transport packets, and stack the remaining values into a FIFO.
Transmit whole packets to the remote host.

When asserting TRSTALL, the receiver 820 is prepared to accept up to 6 more TRDAT words (the equivalent of 2 consecutive FPC packets), plus the 2 words that may be enqueued in the resynchronization pipeline. When releasing TRSTALL, packet word 1 alignment is guaranteed. From a string of IDLE packets most, or sometimes all, can be discarded and not shipped to the remote host, to reduce bandwidth. Unimplemented opcodes and FPC word 3 (7'h5x) should also be flagged as synchronization errors, and treated as 1-word packets.

The 3rd word of FPC is encoded in the style of a single-word packet (e.g., code 7'h5x). Whether in sync or not, it may be assumed that the word following any word of, e.g. 7'h5x, is a word 1 of a new packet. For the purpose of tracking word 1, OVERFLOW, RESYNC, SLEEP and END packets should be treated as 1-word packets. When 7'h7D is treated as a 1-word packet, the following packet will then always be a word 1 value, even if it is another 7'h7D (the paired RESYNC word). Word 1-aligned (pseudo) data is passed to the doublet analysis, where synchronization failure is recognized when two RESYNC do not appear contiguously in the stream. Likewise, OVERFLOW (7'h77) can appear when the receiver is out of sync, and must be accurately interpreted even if the 2nd word does not match. This could also flag a synchronization error. Similar reasoning can be applied to SLEEP and END packets since, if the receiver is out of sync, only one 7'h7C or 7'h7F might appear at the end, and it would be unsuitable for the receiver to hang while waiting for a second value. At the other extreme, three identical words might appear, and should not confuse the receiver either.

For complete analysis, host 830 must compare the trace data to the original source code used to program the microprocessor. For most instructions, the trace data declares that execution occurred, but the operational details are not included. When branches produce only EX packets (TRFPCB=0), the branch destination can only be determined by examining the source code. Similarly, according to a specific embodiment, writing to PCLATH emits only partial data, and requires source knowledge to complete the evaluation. Depending on the operation, STALL packets may precede or follow the affected instruction. STALL packets may be viewed as a suggestion that a non-typical operation has taken place (e.g., file select register (FSR) writing to non-volatile memory), with a highlighted notation on the user's display. WATCH reports may lag the triggering instruction by many packets. Densely populated watches may actually be lost if the same watch triggers before read-out occurs. Since watchpoints identify only the data address, trace analysis must be able to reconstruction data access pointer values, whether from direct-addressing modes (requiring knowledge of BSR and the opcode) or from indirect modes (requiring knowledge of FSRs). Watch data is always from the most-recent occurrence of the watch event. Beware that some FPC packets imply that instructions have executed (e.g., RETURN instructions), but other instances are simply informative.

Figure 12:
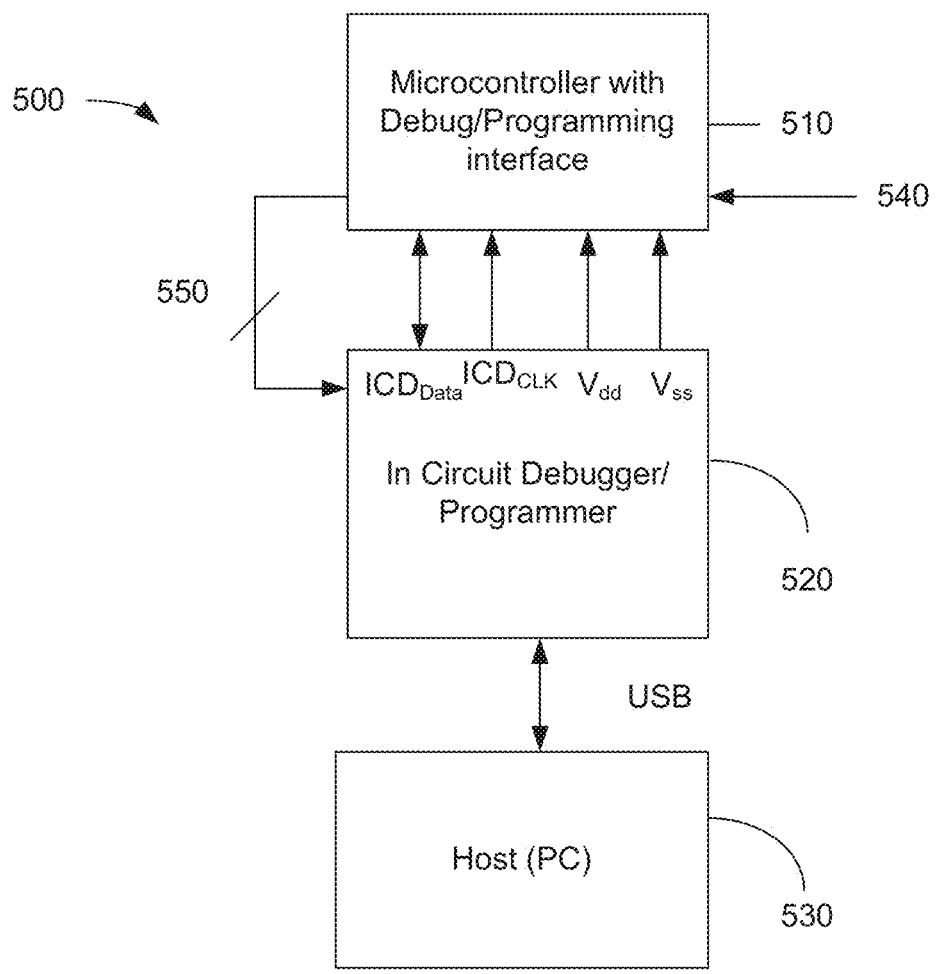
FIG. 12 shows a block diagram of a system using a microcontroller with an embedded debug unit according to various embodiments and an external in circuit debug (ICD) controller.

FIG. 12 shows a typical debugging/programming system 500 with a host such as a personal computer running a development program and being connected, for example via a USB interface with an external debugger/programming unit 520. The external debugger programming unit 520 provides for a dedicated interface which may supply a power supply voltage generated within the debugger/programmer 520. However, other embodiments may supply the supply voltage via a dedicated power source or the target system may be self powered. The actual debug/programming interface may be provided by a synchronous serial interface with a unidirectional clock signal $ICD_{CLK}$ provided by the debugger/programming unit 520 and a bidirectional data line $ICD_{Data}$. Thus, at a minimum three connection lines, $ICD_{CLK}$, $ICD_{Data}$, and reference potential (GND) may be used to couple the debugger/programming unit 520 with the target system 510 which as a minimum may be a microcontroller with a debugging/programming interface according to various embodiments as described above. In addition, an external trigger in signal 540 as described above may be implemented in the target system 510 as shown in FIG. 12 or the in circuit debugger/programmer 520 and trace signals are forwarded by the target device 510 to the in circuit debugger/programmer through dedicated signal lines 550.

Such a system allows a user to program the debugging program running on the host to set various breakpoints having conditions as explained above and receive trace information while the program is executing in real time. While the debugging software keeps track of the various breakpoints with respect to their position in the source code, the debugger/programmer 520 communicates the breakpoint information to the target device which sets the respective breakpoints and configures its associated registers. Also, setting and configuration of the trace capabilities are communicated by the debugger/programmer 520 to the target device 510. For example, a specific breakpoint being triggered by a match of a data value stored in memory may be set. A user then starts execution of the software of the target device 510 through the debugger software running on the host PC 530. The execution of the target software is only stopped when a breakpoint is detected. However, trace information is forwarded continuously during execution of the target program. The host computer 530 can evaluate this trace data and make it available in either text form or using a graphical display.

The present embodiments allow for a better analysis of a trace stream by implementing the features as discussed above. The various embodiments therefore advance the state of the art in on-chip debug capabilities, and will allow to bring high tech debugging capabilities to more, different users.

What is claimed is:

1. A processor device having debug capabilities, comprising:
    a central processing unit;
    debug circuitry including a trace module and an external interface;
    wherein the trace module generates a trace stream including information about executed instructions, wherein the trace stream is output through the external interface;
    and wherein the trace module is further operable to detect an asynchronous trigger signal and upon detection to synchronize the asynchronous trigger signal to a system clock and to generate a trace trigger packet while the asynchronous trigger signal is synchronized and to insert a trace packet into the generated trace stream,
    wherein the asynchronous trigger signal is a trigger signal applied through an external pin of the processor device.

2. The processor device according to claim 1, wherein additional trigger signals are generated by an internal event.

3. The processor device according to claim 2, wherein the internal event comprises at least one of: a breakpoint, a master clear, an interrupt, an exceptional execution condition, a debugger overflow condition.

4. The processor device according to claim 1, wherein the trace stream is packet based.

5. The processor device according to claim 1, wherein the trace packet includes information about a trigger source.

6. The processor device according to claim 5, wherein the information is provided conditionally, wherein the condition can be user defined.

7. The processor device according to claim 1, wherein the processor device has multiple function pins and one pin can be assigned to operate as the trigger input for the asynchronous trigger signal.

8. The processor device according to claim 1, wherein the trace packet is inserted into the trace stream at a point in the trace stream that is time consistent with the execution of a reported instruction at the time of reception of the asynchronous trigger signal.

9. The processor device according to claim 1, wherein the debug circuitry further comprises an event combiner operable to combine a plurality of events, wherein an event can be created at least by one of: a breakpoint and said asynchronous trigger signal.

10. The processor device according to claim 9, wherein the trace packet identifies the breakpoint or breakpoints that caused an event.

11. The processor device according to claim 1, further comprising a noise reject filter coupled with an external pin receiving said asynchronous trigger signal.

12. The processor device according to claim 1, wherein the trace module is programmable to detect a positive or negative edge of the asynchronous trigger signal.

13. A method for debugging executed code within a processor device, comprising:
    executing code by a central processing unit (CPU);
    generating a trace stream of instructions executed by the CPU;
    receiving an asynchronous trigger signal through an external pin of the processor device;
    upon determining of the asynchronous trigger signal:
        synchronizing the asynchronous trigger signal to a system clock;
        generating a trace trigger packet identifying the asynchronous trigger signal while the asynchronous trigger signal is synchronized; and
        inserting a trace packet identifying the asynchronous trigger signal into the trace stream.

14. The method according to claim 13, wherein an additional trigger signal is generated by an internal event.

15. The method according to claim 14, wherein the internal event comprises at least one of: a breakpoint, a master clear, an interrupt, an exceptional execution condition, a debugger overflow condition.

16. The method according to claim 13, further comprising outputting the trace stream through a debug interface upon request.

17. The method according to claim 13, wherein the trace packet is inserted into the trace stream at a point in the trace stream that is time consistent with the execution of a reported instruction at the time of reception of the asynchronous trigger signal.

18. The method according to claim 13, wherein the trace stream is packet based.

19. The method according to claim 18, wherein a trace packet includes information about a trigger source.

20. The method according to claim 19, wherein the information is provided conditionally, wherein the condition can be user defined.

21. The method according to claim 13, further comprising:
creating an event at least by one of: a breakpoint and said asynchronous trigger signal;
combining a plurality of events to generate a debug function.

22. The method according to claim 21, wherein the trace data identifies the breakpoint or breakpoints that caused an event.

23. The method according to claim 22, wherein the debug function is a trigger out signal or a halt.

24. The method according to claim 13, further comprising filtering said asynchronous trigger signal by a noise reject filter coupled with an external pin.

25. The method according to claim 13, further comprising programming the trace module to detect a positive or negative edge of the asynchronous trigger signal.

* * * * *